(12) United States Patent
Hovel et al.

(10) Patent No.: US 7,288,446 B2
(45) Date of Patent: Oct. 30, 2007

(54) SINGLE AND DOUBLE-GATE PSEUDO-FET DEVICES FOR SEMICONDUCTOR MATERIALS EVALUATION

(75) Inventors: Harold J. Hovel, Katonah, NY (US); Thermon E. McKoy, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/219,919

(22) Filed: Sep. 6, 2005

(65) Prior Publication Data

US 2006/0006383 A1 Jan. 12, 2006

Related U.S. Application Data

(62) Division of application No. 10/696,632, filed on Oct. 29, 2003, now Pat. No. 6,955,932.

(51) Int. Cl.
*H01L 21/00* (2006.01)
*H01L 21/84* (2006.01)

(52) U.S. Cl. ............ 438/164; 438/39; 438/153; 257/E21.377

(58) Field of Classification Search ........ 438/164, 438/412, 149, 151, 153–154, 39; 257/E21.377
See application file for complete search history.

(56) References Cited

U.S. PATENT DOCUMENTS 5,308,779 A * 5/1994 Sarma .................. 438/164
5,663,078 A 9/1997 McCarthy
5,840,602 A * 11/1998 Han et al. ............... 438/153
6,429,145 B1 8/2002 Hovel
6,846,715 B2 1/2005 Fitzgerald et al.

OTHER PUBLICATIONS

"Temperature And Magnetic Field Dependence Of The Carrier Mobility In SOI-Wafers By The Pseudo-MOSFET Method," Electrochemical Society Proceedings, by C. Rossel, et al., pp. 479-486, 2003.
"Si Film Electrical Characterization in SOI Substrates by the HgFET Technique," Solid State Electronics, by H.J. Hovel pp. 1311-1333, 2003.

(Continued)

*Primary Examiner*—Thanhha S. Pham
(74) *Attorney, Agent, or Firm*—Scully, Scott, Murphy & Presser, P.C.; Robert M. Trepp, Esq.

(57) ABSTRACT

Several methods and structures are disclosed for determining electrical properties of silicon-on-insulator (SOI) wafers and alternate versions of such wafers such as strained silicon:silicon/germanium:-on-insulator (SSGOI) wafers. The analyzed electrical properties include mobilities, interface state densities, and oxide charge by depositing electrodes on the wafer surface and measuring the current-voltage behavior using these electrodes, In a single gate structure, the source and drain electrodes reside on the wafer surface and the buried insulator acts as the gate oxide, with the substrate acting as the gate electrode. In a double gate structure, an oxide is used on the upper surface between the source and drain electrodes and an additional metal layer is used on top of this oxide to act as a second gate electrode. Light of broad spectrum or specific wavelength may be used to alter electrical carrier densities in the region between the electrodes to further analyze the electrical properties of the material, or alternatively, the device can be used as a detector of light having a wavelength shorter than the bandgap wavelength of the Si surface.

6 Claims, 11 Drawing Sheets

OTHER PUBLICATIONS

"Extremely Low Resistivity Erbium Obmic Contacts To n-type Sillcon," Physics Letters, by P.L. Janega, et al., pp. 1415-1417, 1989.

"The Schottky-barrier Height Of The Contacts Between Some Rare-earth Metals (and silicides) And p-type Silicon," American Institute of Physics, by H. Norde, et al., pp. 865-867.

* cited by examiner

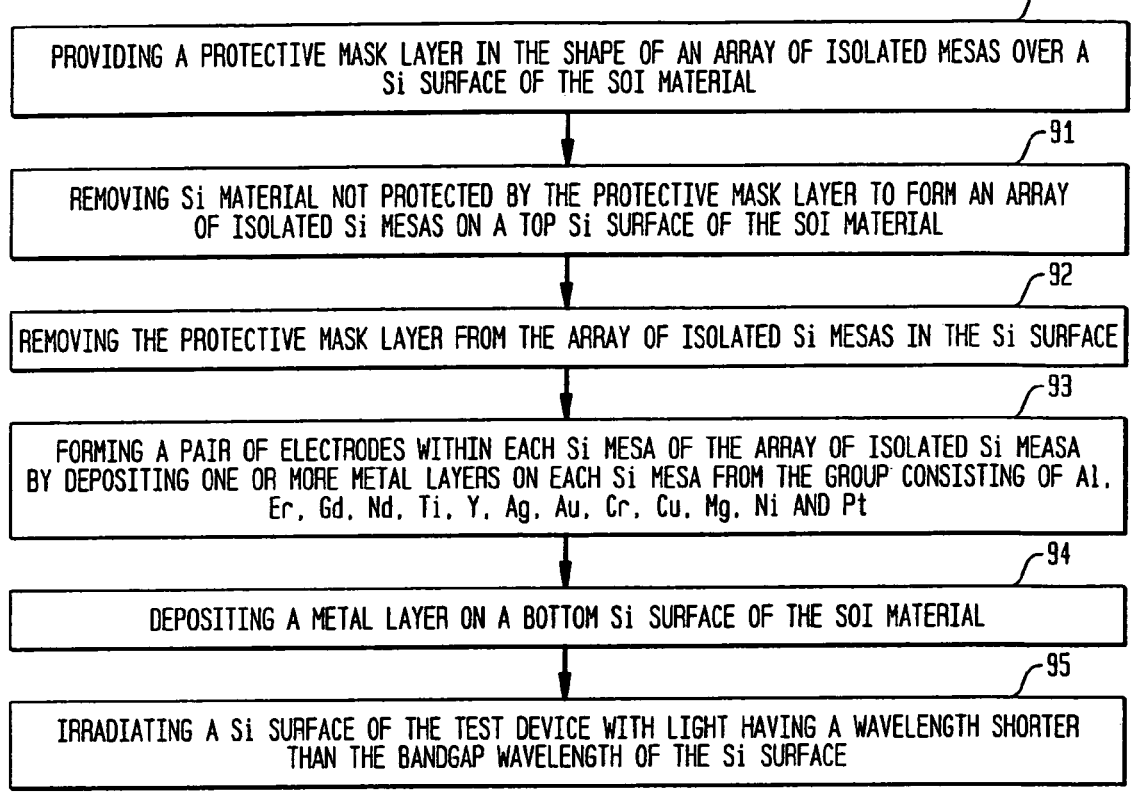
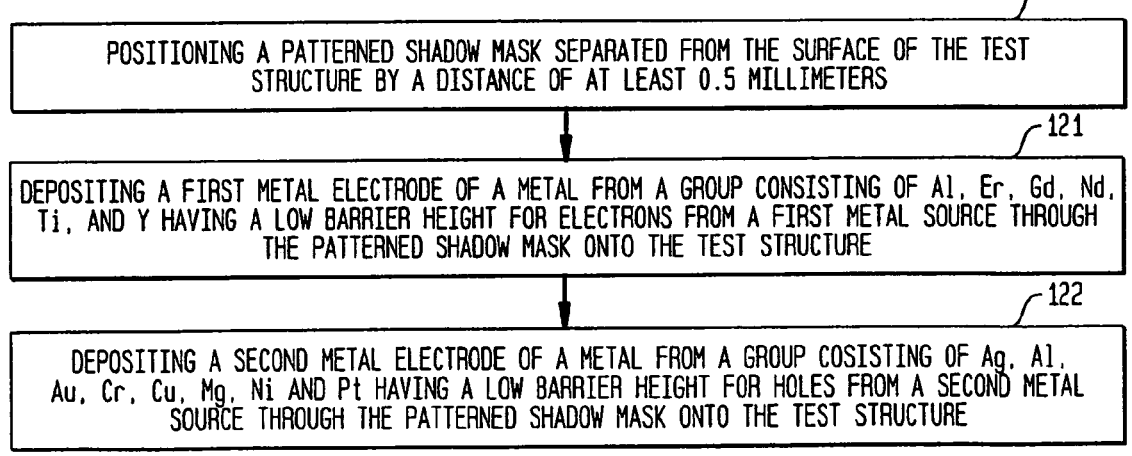

SINGLE AND DOUBLE-GATE PSEUDO-FET DEVICES FOR SEMICONDUCTOR MATERIALS EVALUATION

RELATED APPLICATIONS

This application is a divisional of U.S. application Ser. No. 10/696,632, filed Oct. 29, 2003 now U.S. Pat. No. 6,955,932.

BACKGROUND

1. Field of the Invention

The present invention is directed to a method of determining electrical properties of silicon-on-insulator (SOI) wafers and alternate versions of such wafers such as strained silicon:silicon/germanium:-on-insulator (SSGOI) wafers. More specifically, the subject invention analyzes electrical properties of such SOI wafers such as mobilities, interface state densities, and oxide charge by depositing electrodes on the wafer surface and measuring the current-voltage behavior using these electrodes. In a single gate structure, the source and drain electrodes reside on the wafer surface and the buried insulator acts as the gate oxide, with the substrate acting as the gate electrode. In a double gate structure, an oxide is used on the upper surface between the source and drain electrodes and an additional metal layer is used on top of this oxide to act as a second gate electrode. Light of broad spectrum or specific wavelength may be used to alter electrical carrier densities in the region between the electrodes to further analyze the electrical properties of the material. Alternatively, the device can be used as a detector of light having a wavelength shorter than the bandgap wavelength of the Si surface.

2. Background of the Prior Art

Silicon-on-insulator (SOI) substrate material is used as an alternative to standard "bulk" silicon substrates for creating integrated circuits. SOI substrates consist of a bulk wafer covered with a thin insulator, commonly known as the buried oxide (BOX), and further covered by a thin Si layer. SOI substrates are available in a variety of forms with varying silicon and insulator thicknesses and various processes for manufacturing the substrates. For example, SIMOX is a version of SOI material created by ion implantation of oxygen into silicon followed by high temperature heat treatment. Another version of SOI material is created by bonding one silicon wafer onto another with a SiO2 layer in between, followed by heat treatment and removal of most of one of the wafers in order to reduce it to a thin layer residing on the buried oxide layer and gunderlying silicon bulk region. Since there are various ways to fabricate SOI wafers and since they come in several forms, it is necessary to characterize the virgin starting substrates by a fast and convenient technique to separate good material from bad and good fabrication processes from bad ones.

One technique for accomplishing the material quality evaluation has been discussed in U.S. Pat. No. 6,429,145 for a Method of Determining Electrical Properties of Silicon-On-Insulator Wafers, and in U.S. patent application Ser. No. 09/770,955, filed Jan. 26, 2001, Measurement and Analysis of Mercury-Based Pseudo-Field Effect Transistors, in which two electrodes consisting of mercury are present on the surface of a SOI wafer and a voltage is applied between them. The bottom of the wafer is also contacted and acts as the gate of the field effect transistor, with the BOX acting as the "gate oxide." Field effect transistors which use the buried insulator as the gate insulator and substrate as the gate electrode are commonly known as pseudoFETs. By analyzing the current voltage behavior for various combinations of voltages between these three electrodes, electrical properties such as the electron and hole mobilities, charge residing in the BOX, interface state densities, and doping level in the Si film can be determined. Further discussion of the technique is available in H. J. Hovel, "Si Film Electrical Characterization in SOI Substrates by the HgFET Technique," Solid State Electronics 47, 1311 (2003). The HgFET has been very useful for quality control of SOI material with starting Si thicknesses of 400 to 500 Angstroms or above.

However, the mercury-based pseudoFET (HgFET) becomes difficult to use as the thickness of the Si layer is reduced below several hundred Angstroms because the threshold voltage of the HgFET can become comparable to the breakdown voltage of the underlying BOX. It also is not useful for multi-layer structures such as strained silicon on silicon/germanium on oxide where the electrical properties of the two layers act in parallel and the HgFET cannot separate them. The HgFET also cannot be used at temperatures more than a few degrees above or below normal laboratory ambient temperatures (15-25 degrees Celsius) so that no electrical properties as a function of temperature can be obtained. The HgFET cannot be used to detect light or to use light as a further evaluation technique because it is virtually always used in an upside down configuration due to the liquid mercury electrodes and therefore is in the dark. It also incorporates a chemical treatment step with hydrofluoric acid (HF) that increases the measurement time and reduces the number of separate devices that can be used to evaluate material over an extended surface area.

Replacing the mercury contacts with evaporated metal contacts overcomes many of these disadvantages. In addition, the metal can act as an ohmic contact which reduces the undesirable impedance represented by the electrode, whereas the mercury acts as a Schottky barrier which has high impedance. Ohmic contacts to silicon can be made with metals such as erbium (Er), titanium (Ti), gold (Au), silver (Ag), aluminum (Al), platinum (Pt), gadolinium (Gd), neodymium (Nd), yttrium (Y), magnesium (Mg), and nickel (Ni) and combinations thereof. Er and Ti are commonly used as ohmic contacts to n-type silicon, as discussed in prior art such as Applied Physics Letters 55, 1415 (1989) and Applied Physics Letters 38, 865 (1981) while Au, Ag, Al, and Pt are used as ohmic contacts to p-type silicon. In the evaporated metal pseudo-FET, also commonly known as a RingFET, it is desired to make an ohmic contact to the carrier type created by the FET behavior regardless of the doping type of the silicon layer. Thus, Er- and Ti-based contacts are made for obtaining the electron channel properties created by FET action regardless of whether the material is p-type or n-type, and similarly Au-, Al-, Ag-, Mg-, and Pt-based contacts are used to obtain the hole channel properties created by FET action whether the material is n-type or p-type. This differs from the prior art where Er and Ti are used to make ohmic contacts to n-type material and form Schottky barriers to p-type material, and are therefore not used for making ohmic contacts to p-type silicon. In the ringFET, Er- and Ti-based metal contacts are used as ohmic contacts to the electrons in the inversion layer, even though the silicon is routinely p-type.

Pseudo-FET devices for SOI material measurements as a function of temperature using point contacts or evaporated Al contacts have been described in Rossel et al, Electrochemical Proceedings Vol. 2003-05, page 479. No mention is made of double gate devices, devices with surface oxides, or other metal contacts. The same Conference Proceedings contain technical papers dealing with double gate devices and with strained Si/SiGe devices. In these cases, integrated circuit processing is needed to fabricate devices capable of yielding electrical properties, including ion implantation to dope the layers and high temperature annealing. The resulting properties are therefore of processed material rather than the virgin starting material. In the present invention, no ion implantation or high temperature annealing are used, and no photolithography is required, although one simple photolithography step can be used to optimize the device if desired.

SUMMARY OF THE INVENTION

Single gate pseudoFETs with two electrodes on the Si surface are made by depositing Er, Y, Gd, Nd, or Ti with or without a protective coating of another metal such as Au, Ag, Pt, Ni, or Al. These devices are used to obtain the electrical properties of electrons in Si layers regardless of the Si thickness in the SOI material. Single gate pseudo FETs with electrodes of Au, Ag, Pt, Mg, Ni, or Al (heated to 500° C.) are used to obtain the electrical properties of holes in the Si layers regardless of the Si thickness in the SOI material. Dual metal electrode layers such as ErAg, TiAu can be used in a single device to obtain both the electron and hole properties by offsetting the metal layers so that portions of both the Er or Ti and Ag or Au are in contact with the Si surface. Incident light can be used to further obtain electrical properties, by shining light in the spaces between the electrodes where the semiconductor is exposed. Double gate pseudoFETs with a gate oxide and three electrodes on the top surface can be used to obtain the electrical properties of the top layer in a multi-layer SOI structure using Er- or Ti-based contacts for electron properties or Al-or Ag-based contacts for hole properties, or offset combinations of these metals to obtain both hole and electron properties. Incident light may also be used to further probe the device. Both the single and double gate devices can be made with fast turn-around techniques using shadow masks for evaporation or sputtering of metal contacts and without high temperature processing or photolithography. However, it is also possible to fabricate single and double gate RingFET devices using photolithography techniques to minimize parasitic resistances between the electrodes.

Light of broad spectrum or specific wavelength may be used to alter electrical carrier densities in the region between the electrodes to further analyze the electrical properties of the material. Alternatively, the device can be used as a detector of light having a wavelength shorter than the bandgap wavelength of the Si surface.

BRIEF DESCRIPTION OF THE DRAWINGS

FIG. 9 is a flow diagram of a method of the present invention for producing a test device for silicon-on-insulator (SOI) material by first forming mesa test structures and then forming electrodes within each mesa.

FIG. 12 is a flow chart of a method of the present invention for creating offset multiple layers of source and drain metal electrodes in an FET device test structure.

DETAILED DESCRIPTION OF THE INVENTION

Figure 1:
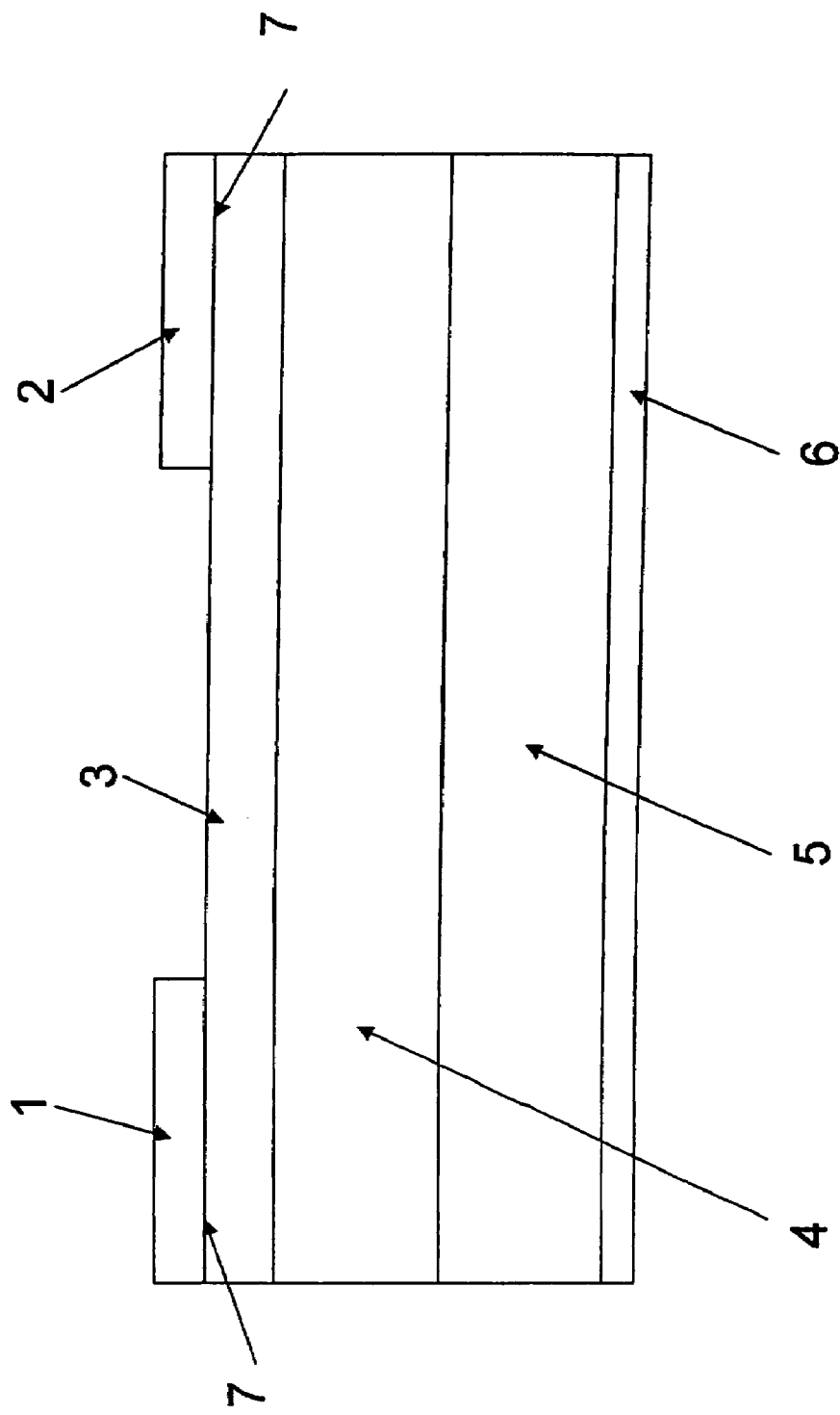
FIG. 1 is a schematic representation of a single gate pseudo FET structure.

FIG. 1 shows a cross section of a single gate pseudo FET device. Silicon layer 3 resides on a buried oxide insulator 4 which resides on a Si bulk region 5. The bottom of the FET is contacted with metal 6 such as sputtered Au, Al, Cu, Cr, or other metal to provide a wide area bottom contact. (However, pseudoFET devices have been known to function satisfactorily without a bottom metal layer when the doping level and device area are sufficiently large.) Source electrode 1 and drain electrode 2 are made with Al, Er, Gd, Nd, Ti or Y, covered by Ag, Al, Au, Cr, Cu, Mg, Ni or Pt in order to provide an ohmic contact to electrons at interface 7 between the Si and electrode. Electrodes 1 and 2 may also be made with Au, Ag, Pt, Al, or Mg with-or without additional covering metal to provide ohmic contact to holes at interface 7. The metal electrodes 1, 2, and 6 may be provided by evaporation or sputtering, for example. The device may be rectangular, circular, or another geometric shape. Light may be directed onto the semiconductor surface between electrodes 1 and 2 to provide additional types of electrical measurements. The light is absorbed partly in the Si layer 3 and creates electrons and holes which can participate in the electrical behavior.

Figure 2:
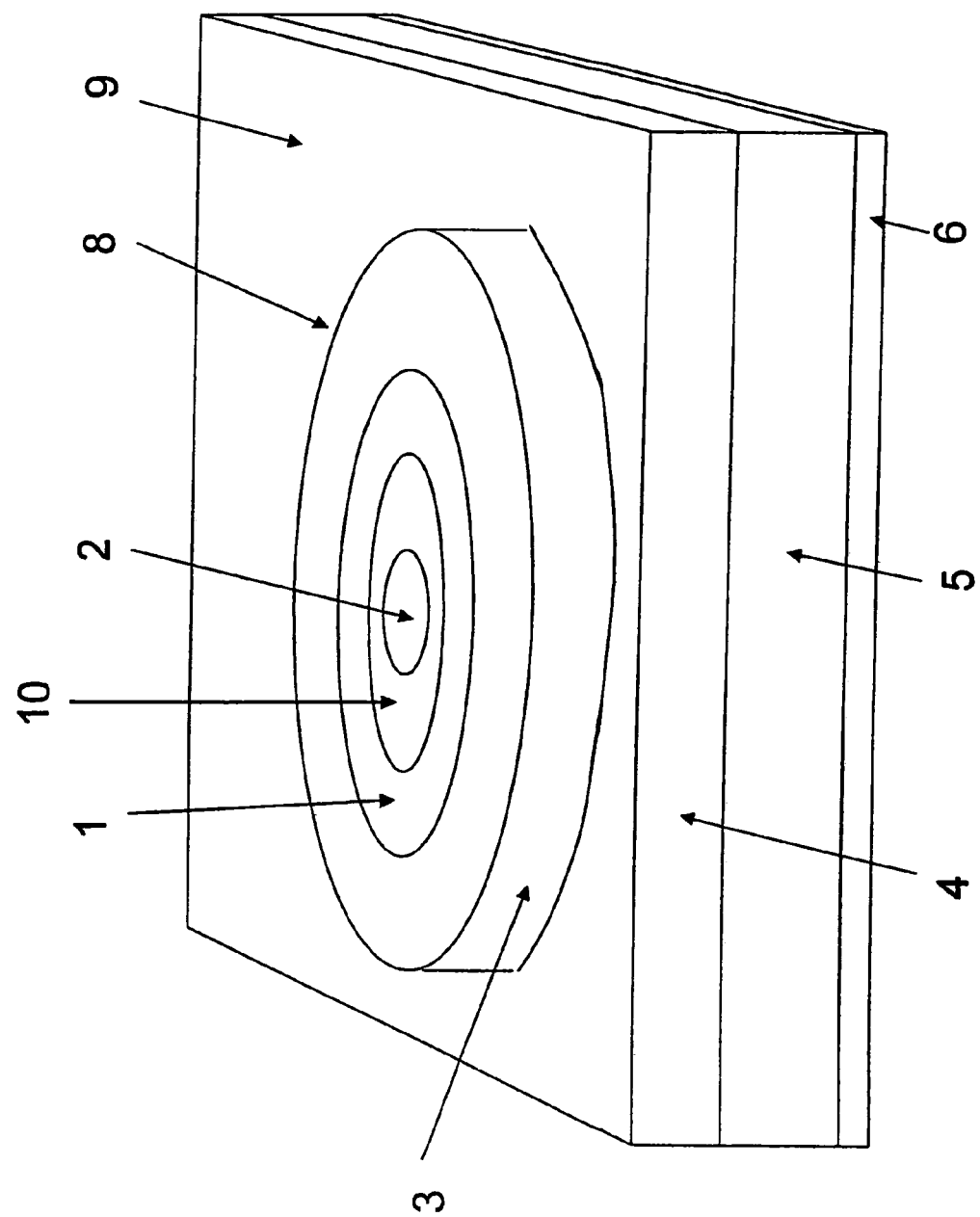
FIG. 2 is a schematic of a single gate RingFET.

FIG. 2 shows a circular form of the single gate pseudo FET which will be termed a RingFET. The drain electrode 2 is surrounded by the concentric source electrode 1. A mesa 8 is etched through the thickness of the Si layer 3 to expose the surface 9 of the buried oxide 4. Creating the mesa is carried out to reduce or eliminate surface leakage components which are undesirable parasitic currents in the device. It also isolates each device from the others that may be present in a device array. The silicon region 10 between source 1 and drain 2 is not covered by metal and may be illuminated by incident light if desired.

Figure 3:
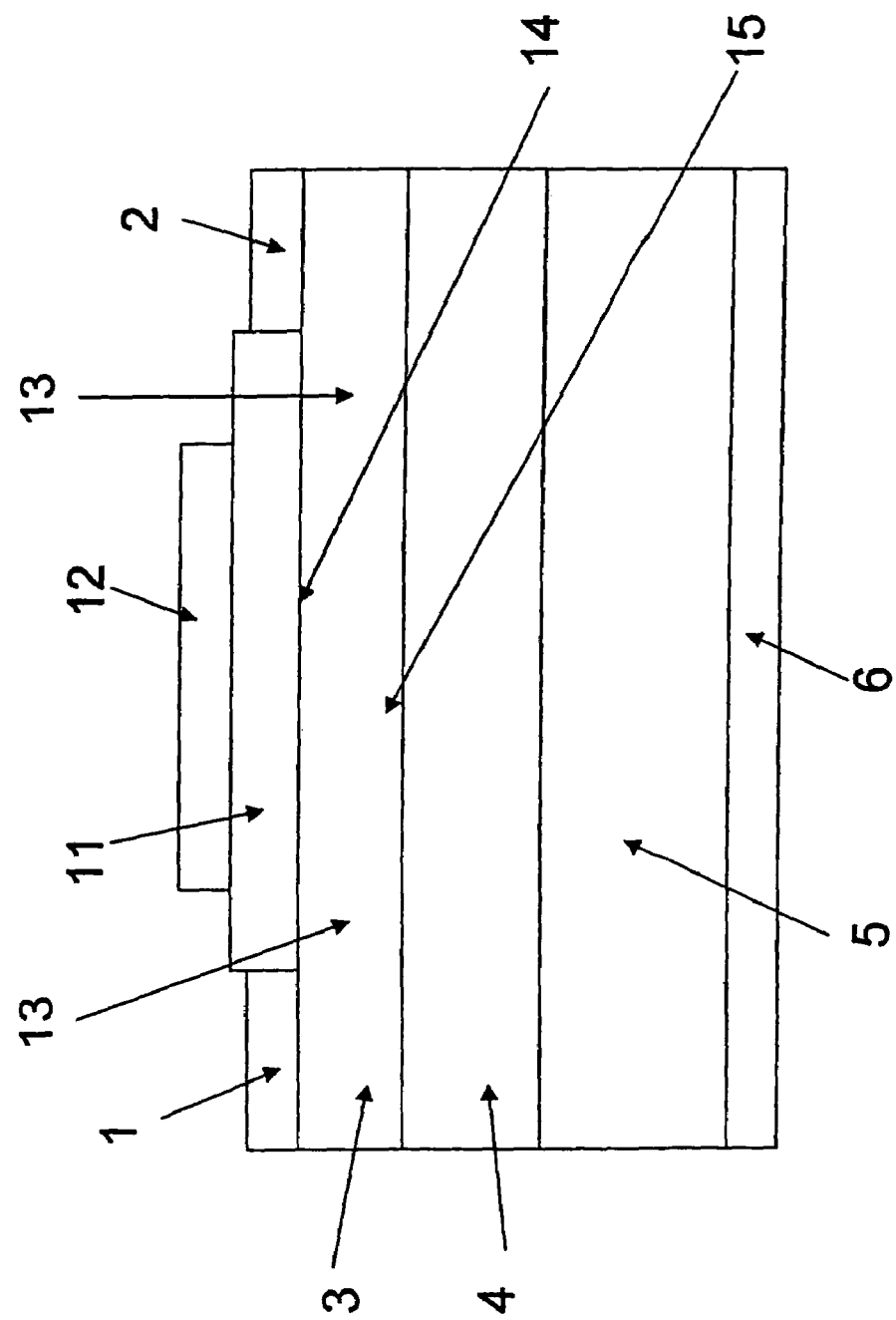
FIG. 3 is a schematic of a double gate pseudo RingFET structure.

FIG. 3 is a schematic of a double gate RingFET. A gate oxide 11 resides on the surface of the Si layer 3 sandwiched between the source electrode 1 and drain electrode 2. A top metal electrode 12 acts as the gate electrode of the top gate FET. Metal electrodes 1, 2, and 12 serve as the source, drain and gate of the top FET, respectively, with oxide 11 as the gate oxide, while electrodes 1 and 2 and Si bulk 5 (contacted by metal 6) act as the source, drain, and gate of the bottom FET. When the top FET is in operation, an inversion (electrons) or accumulation (holes) layer is formed in the Si layer 3 at the top oxide/Si layer interface 14. When the bottom FET is operational, an inversion or accumulation layer is formed in the Si layer 3 at the BOX/Si layer interface 15. In order for the top FET to function properly, the bottom FET must also be operational. If the top FET alone is turned on, the regions 13 between the edges of the source electrode 1 or drain electrode 2 and the edge of the top gate electrode 12 are insulating and would prevent the top FET from functioning. By turning on the bottom FET, by placing a voltage on electrode 6, the entire interface 15 between the BOX 4 and Si layer 3 becomes conducting and the insulating regions are eliminated.

Figure 4:
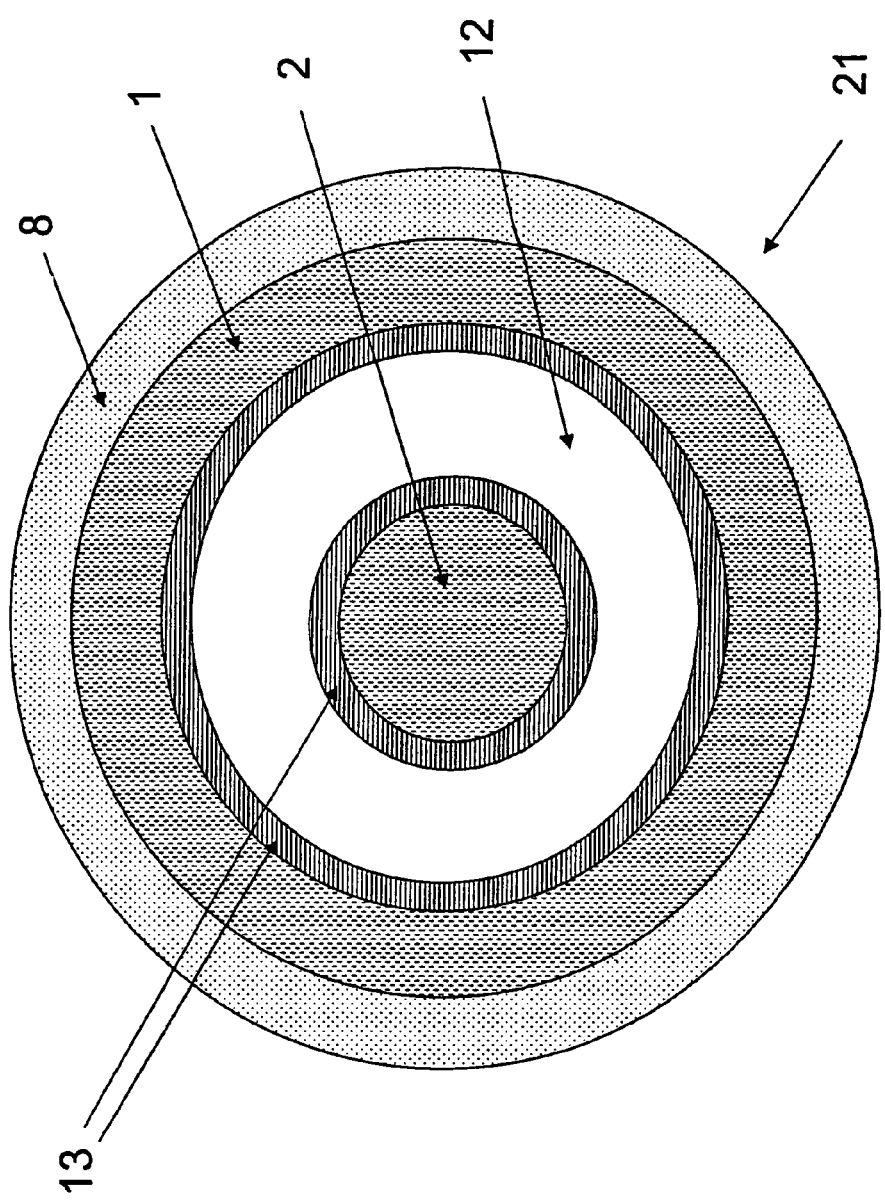
FIG. 4 is a top view of a double gate RingFET.

FIG. 4 is a top view of a double gate Ring FET 21 in which the source 1 and drain 2 are concentric with the top gate 12 and are contained within an etched mesa 8. The side view of the mesa is as shown in FIG. 2 (except for the additional electrodes). The regions 13 between the source and gate and the gate and drain would be insulating as discussed earlier unless the bottom FET is also turned on. The device is shown as circular but other geometries such as square, rectangular, etc. can also be used.

Figure 5:
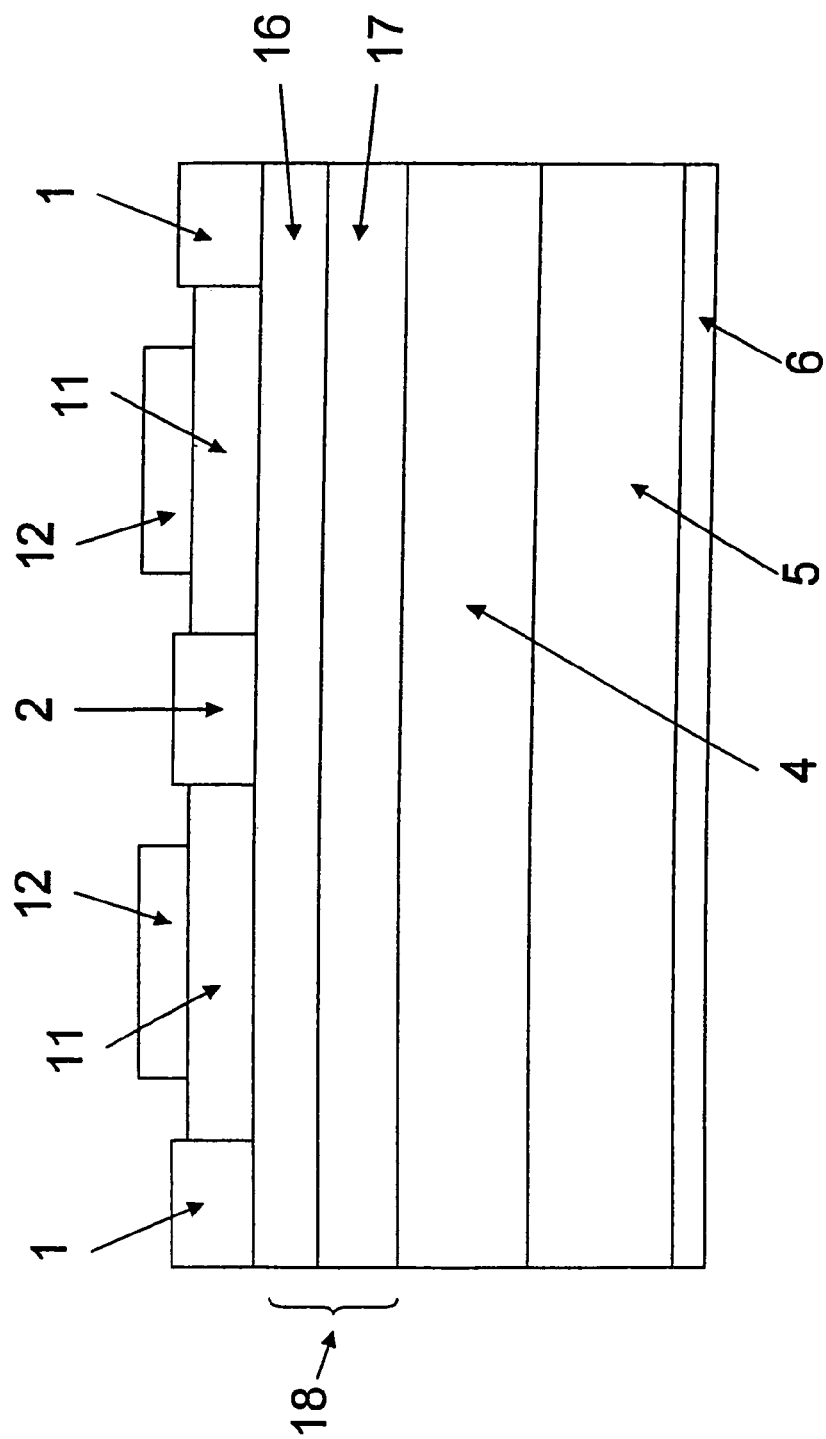
FIG. 5 is a cross section of a double gate RingFET with a multi-layer semiconductor stack above the buried oxide, as shown in FIG. 4.

FIG. 5 is a cross-sectional view of the circular version of the double gate RingFET shown in FIG. 4. As with the single gate RingFET, the device can be circular, rectangular, or another geometry. Source electrode 1 surrounds drain electrode 2 and top gate 12 which resides on oxide 11. The buried oxide is 4 and the bulk of the Si is shown as 5 with bottom contact 6. The active semiconductor layer 3 in previous figures has been redrawn as a region 18 consisting of multiple semiconductor regions 16 and 17; however, region 18 could consist of only 1 semiconductor layer or more than two. Layer 16 could consist of strained silicon, for example, while layer 17 could consist of silicon-germanium. Alternately, layer 16 could consist of a semiconductor compound such as gallium arsenide (GaAs), indium phosphide (InP), or other material from the III-V family of semiconductors. Multilayer 18 could also consist of 3 or more layers; for example, one or more lattice-matching "buffer" layers may be desirable between a bottom Si or SiGe layer and an upper III-V layer. The double gate RingFET device will in all cases be most sensitive to the uppermost layer and allow calculation of its electrical properties while the bottom FET is biased to prevent insulating regions 13 (shown in FIG. 3). Alternatives to biasing the bottom FET include use of strong light to make regions 13 conducting or processing such as ion implantation or diffusion to produce doping in regions 13.

Figure 6:
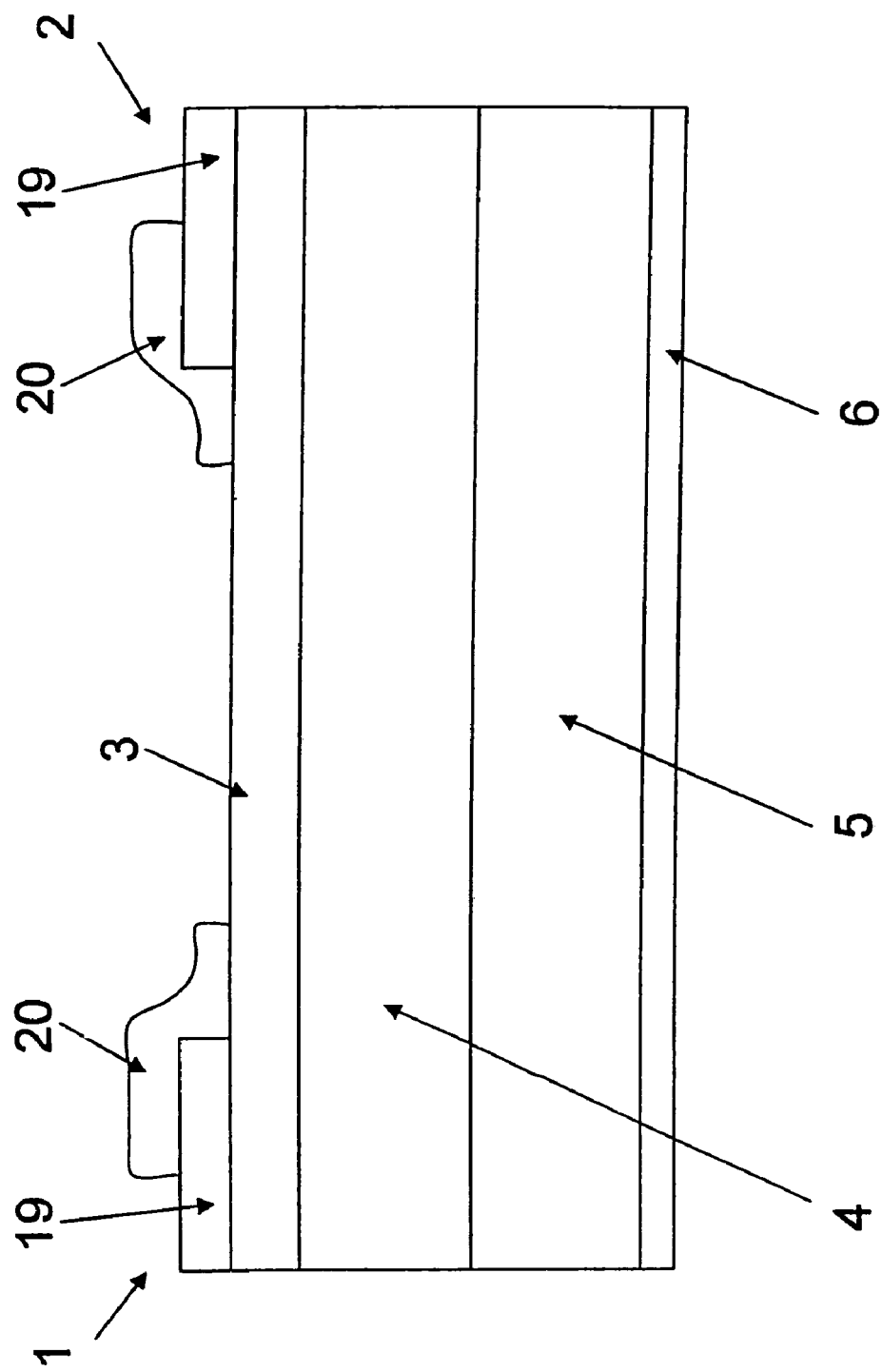
FIG. 6 is a schematic of a pseudoFET with offset source and drain metal electrodes.

FIG. 6 shows a RingFET device in which the source electrode 1 and drain electrode 2 consist of two metals 19 and 20 which are offset from one another. One metal 19 is an ohmic metal such as Al, Er, Gd, Nd, Ti or Y which have low barrier height for electrons and the other metal 20 is an ohmic metal such as Ag, Al, Au, Cr, Cu, Mg, Ni or Pt which have low barrier height for holes. In this way, both the electron and hole electrical properties can be obtained with one device. Without the offset, two separate devices are necessary to obtain both electron and hole properties. The same use of offset source and drain electrodes can be used with double gate FETs as well as single gate devices.

Figure 7:
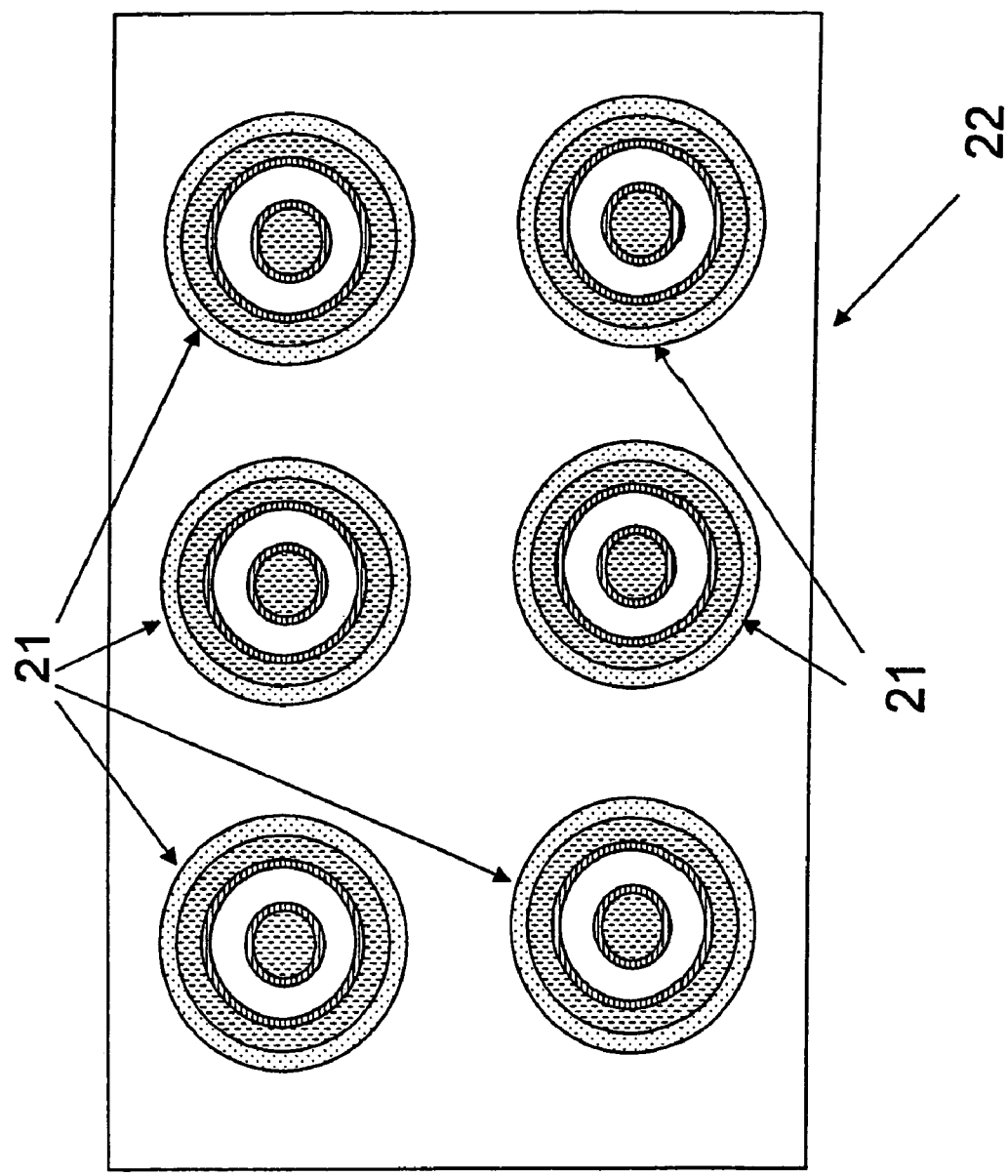
FIG. 7 is a top view of an array of single gate or double gate RingFET devices.

FIG. 7 shows the top view of a test sample 22 having an array of double gate RingFET test devices 21. The test devices could also be single gate RingFET devices and could also be multiple layer devices as shown in FIG. 5.

Figure 8:
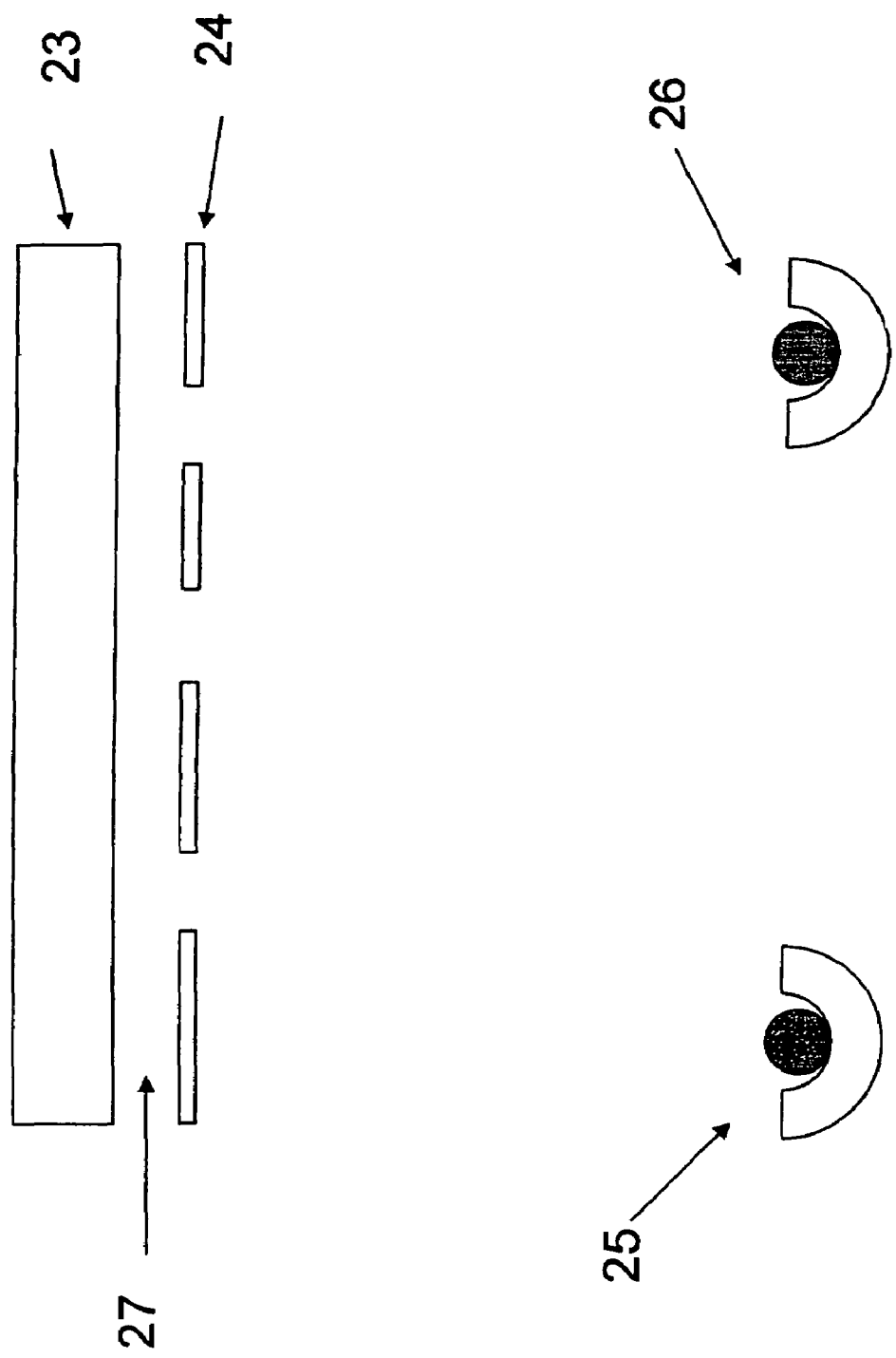
FIG. 8 is a side view of a deposition geometry used to create offset evaporated electrodes.

FIG. 8 shows a test wafer 23 and a shadow mask 24 (a metal mask with openings for deposited, such as evaporated or sputtered, material to reach the test wafer surface in a desired pattern) separated from wafer 23 by spacing 27. A first metal layer is evaporated from source 25 and a second metal layer from source 26. Because of the spacing 27 and the distance between the mask 24 and the sources 25 and 26, the two metal layers will be offset from one another so that some fraction of each deposited metal is in contact with the wafer surface.

EXAMPLES OF THE INVENTION

FIG. 9 is a flow diagram of a first method of the present invention for producing a test device for silicon-on-insulator (SOI) material by first forming mesa test structures and then forming electrodes within each mesa, as in the first exemplary embodiment below. The method comprises: a) at 90 providing a protective mask layer in the shape of an array of isolated mesas over a Si surface of the SOI material; b) at 91 removing Si material not protected by the protective mask layer to form an array of isolated Si mesas in the Si surface; c) at 92 removing the protective mask layer from the array of isolated Si mesas in the Si surface; and d) at 93 forming a pair of electrodes within each Si mesa of the array of isolated Si mesas by depositing one or more metal layers on each Si mesa.

In greater detail, the method includes forming the array of isolated Si mesas on a top Si surface of the SOI material, and at 94 depositing a metal layer on a bottom Si surface of the SOI material. The step of depositing deposits one or more metal layers from the group consisting of Al, Er, Gd, Nd, Ti, Y, Ag, Au, Cr, Cu, Mg, Ni and Pt. At 95, the test device can use irradiation of light of broad spectrum or specific wavelength to alter electrical carrier densities in the region between the electrodes to further analyze the electrical properties of the material. Alternatively, at 95 the test device can be used as a detector of light having a wavelength shorter than the bandgap wavelength of the Si surface.

Figure 10:
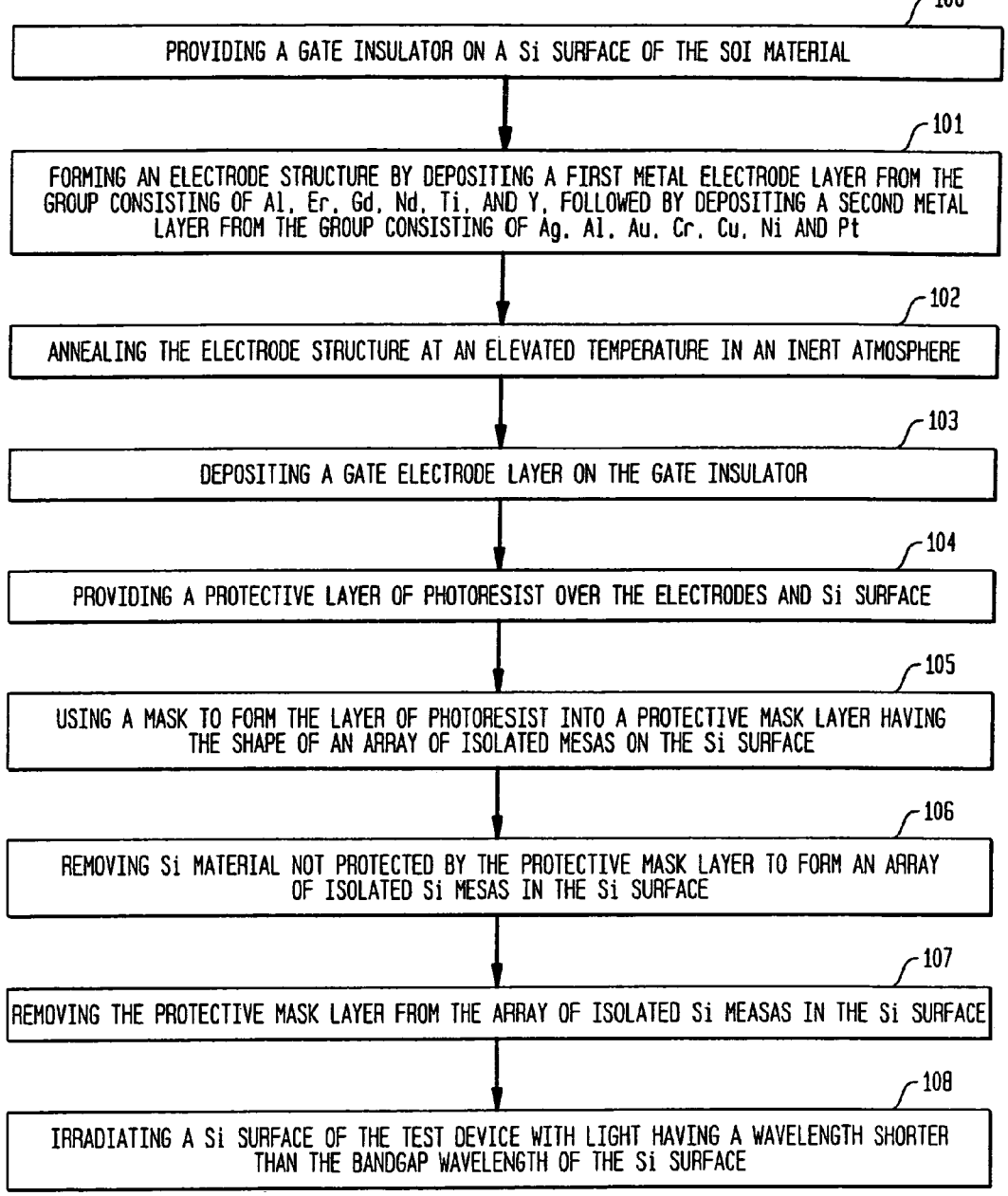
FIG. 10 is a flow chart of a method of the present invention for producing a test device for silicon-on-insulator (SOI) material wherein the metal electrodes are formed prior to formation of the mesas.

FIG. 10 is a flow chart of a method of the present invention for producing a test device for silicon-on-insulator (SOI) material wherein the metal electrodes are formed prior to formation of the mesas, as in the second exemplary embodiment below. The method comprises a) at 100 providing a gate insulator on a Si surface of the SOI material; b) at 101 forming an electrode structure by depositing on the gate insulator a first metal electrode layer from the group consisting of Al, Er, Gd, Nd, Ti and Y, followed by depositing a second metal layer from the group consisting of Ag, Al, Au, Cr, Cu, Mg, Ni and Pt; c) at 102 annealing the electrode structure at an elevated temperature in an inert atmosphere; d) at 103 depositing a gate electrode layer on the gate insulator; e) at 104 and 105 providing a protective layer over the electrodes in the shape of an array of isolated mesas; f) at 106 removing Si material not protected by the protective mask layer to form an array of isolated Si mesas in the Si surface; and at g) at 107 removing the protective mask layer from the array of isolated Si mesas in the Si surface. Step 108 is similar to step 95.

In greater detail, the annealing step is preferably carried out at a temperature of 440 to 475° C. for a period of 5 to 15 minutes in an inert atmosphere. The step of providing a protective layer at 104 includes providing a protective layer of photoresist over the electrodes and Si surface, followed by at 105 using a mask to form the photoresist into a protective mask layer having the shape of an array of isolated mesas on the Si surface. Electrical contacts are then formed to the electrodes of the test device.

Figure 11:
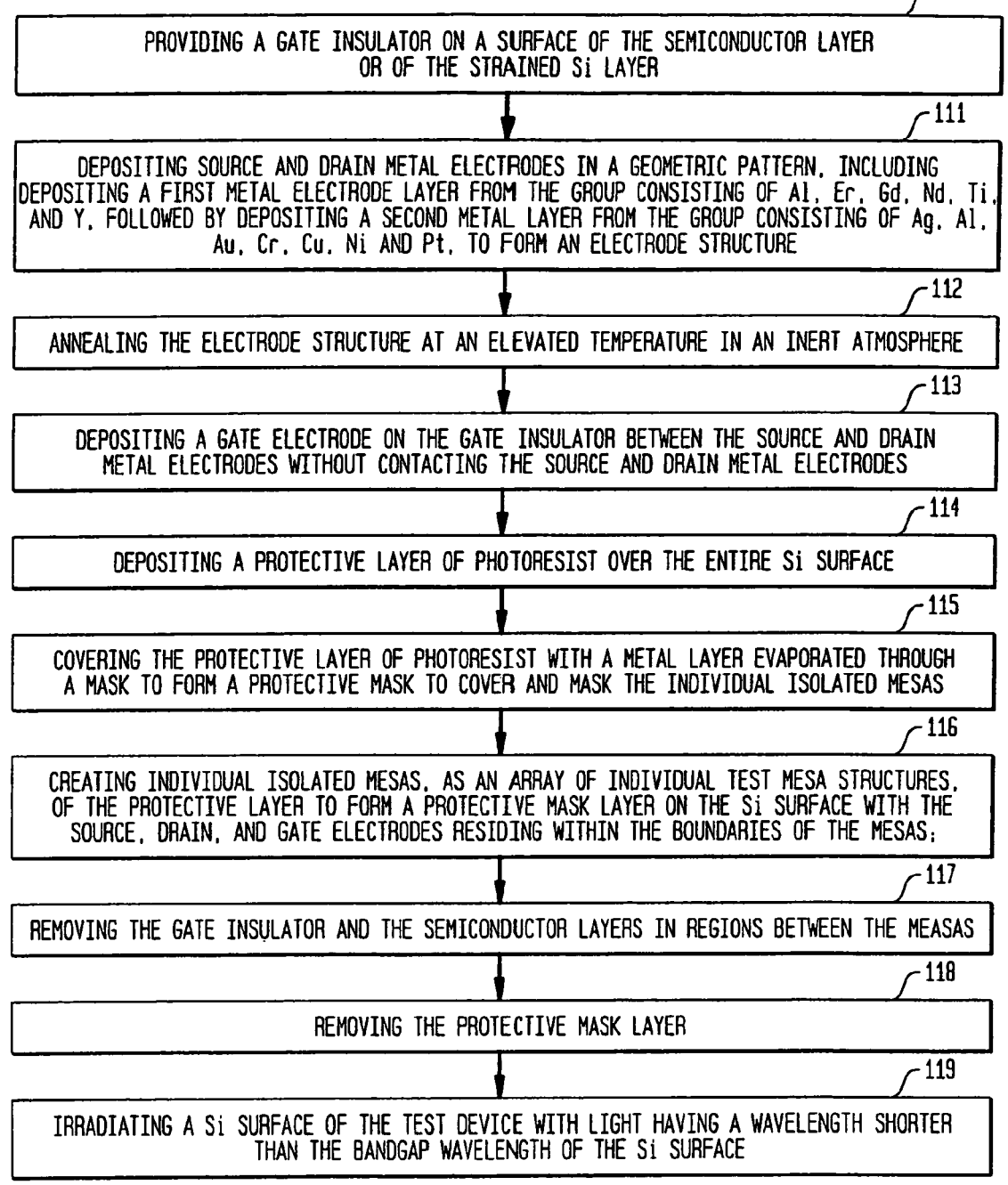
FIG. 11 is a flow chart of a method of the present invention for fabricating double gate FET test structures for electrical evaluation of a semiconductor layer, or of a strained Si layer on a SiGe layer, on a buried oxide on a Si substrate.

FIG. 11 is a flow chart of the present invention for fabricating double gate FET test structures for electrical evaluation of a semiconductor layer, or of a strained Si layer on a SiGe layer, on a buried oxide on a Si substrate as in the third exemplary embodiment below. The method comprises: a) at 110 providing a gate insulator on a surface of the semiconductor layer or of the strained Si; b) at 111 depositing source and drain metal electrodes on the gate insulator in a geometric pattern, including depositing a first metal electrode layer from the group consisting of Al, Er, Gd, Nd, Ti, and Y, followed by depositing a second metal layer from the group consisting of Ag, Al, Au, Cr, Cu, Mg, Ni, and Pt, to form an electrode structure; c) at 112 annealing the electrode structure at an elevated temperature in an inert atmosphere; d) at 113 depositing a gate electrode on the gate insulator between the source and drain metal electrodes without contacting the source and drain metal electrodes; e) at 114 depositing a protective layer over the entire Si surface, and at 115 covering the protective layer of photoresist with a metal layer evaporated through a mask to form a protective mask over the mesas; f) at 116 creating individual isolated mesas of the protective layer to form a protective mask layer on the Si surface with the source, drain, and gate electrodes residing within the boundaries of the mesas; g) at 117 removing the gate insulator and the semiconductor layers in regions between the mesas; h) at 118 removing the protective mask layer; and finally providing electrical contacts to the source, drain, and gate electrodes and an opposed surface of the Si substrate to measure and analyze electrical properties of the test device. Step 119 is similar to step 95.

In greater detail, the annealing step is preferably carried out at a temperature of 440 to 475° C. for a period of 5 to 15 minutes in an inert atmosphere of N2 and H2. The method includes depositing a protective layer of photoresist, and covering the protective layer of photoresist with a metal layer evaporated through a mask to form a protective mask to cover and mask the individual isolated mesas. The test structures are fabricated as an array of individual test mesa structures. The gate electrode thickness can be deposited as a metal film greater than 50 mn so that it is opaque to light, or less than 30 nm so that it is a transparent conductive material. The semiconductor layer can contain a region of strained Si, or regions of strained Si and SiGe, or a region of one or more layers made from compounds from the III and V columns of the periodic table.

FIG. 12 is a flow chart of a method of the present invention for creating offset multiple layers of source and drain metal electrodes in an FET device test structure, as exemplified in FIGS. 6 and 8. The process comprises a) at 120 positioning a patterned shadow mask separated from the surface of the test structure by a distance of at least 0.5 millimeters; b) at 121 depositing a first metal electrode from a group consisting of Al, Er, Gd, Nd, Ti and Y from a first metal source through the patterned shadow mask onto the test structure; and c) at 122 depositing a second metal electrode from a group consisting of Ag, Al, Au, Cr, Cu, Mg, Ni and Pt from a second evaporation source through the patterned shadow mask onto the test structure. The process can create offset multiple layers of source and drain metal electrodes in either a single or a double gate ring FET device test structure.

The present invention also relates to the FET device produced by the process as shown in FIG. 6 which includes a source electrode 1 and a drain electrode 2, wherein each of the source electrode and the drain electrode comprises first and second metals 19, 20 which are formed contacting each other while being offset relative to each other, the first metal comprises an ohmic metal from the group consisting of Al, Er, Gd, Nd, Ti and Y which has a low barrier height for electrons, and the second metal comprises an ohmic metal from the group consisting of Ag, Al, Au, Cr, Cu, Mg, Ni and Pt which has a low barrier height for holes, such that both electron and hole electrical properties can be measured from the offset metal electrodes. The FET device can be either a double gate FET or a single gate FET.

As indicated at 95, 108 and 119, all embodiments of the test device can use light of broad spectrum or specific wavelength to alter electrical carrier densities in the region between the electrodes to further analyze the electrical properties of the material, or alternatively, the test device can be used as a detector of light having a wavelength shorter than the bandgap wavelength of the Si surface.

In a first embodiment of the invention referred to above, a single gate RingFET test sample as shown in FIG. 2 is fabricated by depositing electrodes of Er/Ag on a mesa which is etched using a gold layer as an etch mask for the mesa. For example, the test device is constructed by: 1) exposing the back side of the sample to HF acid to remove the native oxide followed by rinsing and drying; 2) sputtering a back side contact 6 of Au; 3) evaporating a gold layer through a shadow mask having openings corresponding to a pattern of device mesas such as shown in FIG. 7; 4) etching the Si layer completely in the regions between the circular mesas using a mixture of acetic acid, nitric acid, and HF acid, with the Au acting as a "mask" to protect the circles; 5) removing the Au circles with 3:1 HCl:HNO3; 6) exposing the Si mesa surfaces to an HF acid to remove the native oxide followed by rinsing and drying; 7) depositing a first layer of Er 100 nm thick followed by a second layer of Ag 300 nm thick through shadow masks which have openings representing the source and drain electrodes and aligned so the source and drain electrodes are located within the previously etched mesas; 8) contacting the source and drain and bottom electrodes and applying voltages to obtain the electrical behavior of the FET. Titanium can be used in place of Er for the first layer as well as Gd, Y, and Nd, and Au, Al, Cu, Pt, Cr or Ni could be used to replace the Ag for the second layer. The thickness of the first layer can be in the range of 20 nm to 200 nm and the second layer from 50 to 400 nm. The resulting device can be used to determine the electron electrical properties of the material. If hole properties are desired, Au, Ag, or Pt can be used for the first layer and no second layer is needed, or offset source and drain contacts using two metals can be. Other masking layers can also be substituted for the Au film to create the Si mesas, such as alternate metals, spun-on photoresist, or deposited dielectrics such as SiO2. The mesas and electrodes can be circular, rectangular, or another geometry.

In a second embodiment of the invention referred to above, the single gate RingFET test structure is fabricated by depositing the metal electrodes before creating the isolating mesa. For example, the test structure is fabricated by: 1) depositing a layer of Al6 on the bottom side of an SOI test piece; 2) placing shadow masks 24 on the top surface which have openings for the source and drain electrodes and evaporating 100 nm of Er followed by 300 nm of Ag; 3) spin on a protective layer of photoresist and pre-bake at 120° C.; 4) align a shadow mask with openings for the isolating mesas so that the two electrodes for each device will be contained within the mesa; 5) evaporate 400 nm of Ag through the holes in the shadow mask; 6) expose the sample to bright light so that all the photoresist between the mesas will be removed by subsequent chemical treatment; 7) remove the photoresist layer between the Ag mesa pads by placing in photoresist developer; 8) remove the Si layer between the isolation mesas using acetic:nitric:HF solution; 9) remove the Ag pads and photoresist underneath by placing in acetone bath. For the contact electrodes, Ti can be substituted for Er and Au, Al, Cu, Pt, Ni, or Cr for the Ag, and the metal thicknesses can be varied as described above in the first embodiment. The bottom electrode can be made with Au, Ag, Cr, Cu, or Ni as well as Al.

Further embodiments of the present invention can fabricate double gate Ring FET test structures such as illustrated in FIGS. 4 and 5 which incorporate a gate oxide on the upper surface and may include one or more semiconductor layers above the buried oxide. For example, this test structure can be used to analyze the electrical properties of standard SOI with just a single Si layer, a multi-layer of SiGe and strained Si, or multi-layer structures incorporating III-V compound materials. In one embodiment of a double gate RingFET on a strained Si/SiGe substrate, a test structure can be fabricated by: 1) creating a gate insulator 3 to 12 nm thick on the upper surface of the wafer under test; 2) depositing a layer of Au, Ni, Ag, Cu, or Al on the bottom surface of the wafer; 3) placing shadow masks with the appropriate openings for the source and drain electrodes on the upper surface and depositing an Er or Ti first layer through the openings followed by a Ag, Au, Al, Ni, Pt, or Cr second layer; 4) heat treating the wafer at an elevated temperature of 425-550° C., and more preferably 440-475° C., for 5 to 20 minutes, in an inert atmosphere preferably a mixture of N2 and H2, so that the Er or Ti penetrate the gate oxide and contact the upper semiconductor surface; 5) aligning a gate shadow mask on the upper surface with openings for the gate electrode such that the opening is contained between the source and drain electrodes without contacting either; 6) depositing a layer of Al, Ag, Cu, Pt, Ni, or Cr through the openings in the gate shadow mask; 7) spinning on a protective layer of photoresist between 0.5 micrometer and 2 micrometer thick onto the electrode and oxide covered upper surface; 8) align a mesa shadow mask with openings for the isolating mesas so that the electrodes for each device will be contained within the mesa; 9) depositing a protective mask layer of Ag, Cr, Al, Ni, or Au through the mesa shadow mask; 10) removing the photoresist layer between the mesas with photoresist developer; 11) removing the gate oxide between the mesas with HF acid; 12) removing the Si and SiGe layers between the mesas by acetic acid:nitric acid:HF acid solution; 13) lifting off the protective metal layer and underlying photoresist layer covering the mesas by immersing in an acetone bath; 14) contacting the four electrodes (source, drain, top gate, bottom electrode) by appropriate electrical means in order to obtain the electrical behavior of the double gate Ring FET device. The gate insulator may be an oxide produced by oxidation or deposition or may consist of alternate dielectrics such as Al2O3, HfO2, and other insulating materials.

As mentioned earlier, Er, Gd, Nd, Y, and Ti as the metal in contact with the semiconductor enable the electron electrical properties of the material to be analyzed, while Au, Ag, Pt, Ni, or Al heated to 500° C. or above enable the hole properties to be obtained. This normally requires two separate test structures. Both the electron and hole properties can be obtained if the source and drain electrodes consist of two metal layers slightly offset as shown in FIG. 6. This is true for both single gate and double gate RingFETs. One technique to create this offset is to separate the shadow mask used to deposit the source and drain electrodes by a small degree and use a deposition system with asymmetric metal sources as shown in FIG. 8. In one embodiment, a shadow mask is separated from a gate oxide-coated strained Si/SiGe-on insulator wafer (SSGOI) by one millimeter. A metal layer of Er is evaporated from a first source through the shadow mask from a vertical distance of 30 centimeters and a metal layer of Al is evaporated from a second source from a vertical distance of 30 cm and separated from the Er source by a horizontal distance of 15 cm. This results in an offset of approximately 0.25 millimeter, such that ⅓ to ½ of each metal is in contact the semiconductor surface for typical electrode dimensions of 0.5 to 0.75 millimeters.

The presence of bare semiconductor surface between the electrodes allows the use of light to be used as a further tool to characterize the properties of the substrate. For example, light of wavelength shorter than 1 micrometer will be absorbed partly in the upper Si layer, and the fraction absorbed increases as the wavelength is reduced. For III-V compound upper semiconductor layers, light of wavelength shorter than the bandgap wavelength of the layer will be partly absorbed. Once absorbed, the light creates hole-electron pairs which are separated by the voltage between the source and drain electrodes and therefore creates a current. This can be used for example to probe the lifetime of the material which is a measure of the defect density. Alternately, the device is a detector of light since the absorbed light creates such a current. For the single gate ringFET, the space between the source and drain is exposed and open to incident light. For double gate ringFETs, the space between the gate and the source and gate and drain is open to light. However, the upper gate material can be made with a very thin metal layer less than 30 nm thick which is semi-transparent to light, or it can be made with a transparent conductive coating such as In2O3 or SnO2 which is transparent to light. The speed at which light can be detected is increased by making the dimensions of the device smaller.

Either the single or double gate ringFET device can be used at both low and high temperatures. For example, the device can be cooled to liquid N2 temperatures (77° K) or below, or heated to up to 600° C.) to obtain electrical properties of the material as a function of temperature.

Having thus described our invention, what we claim as new and desire to secure by Letters Patent is:

1. A method for producing a test device for silicon-on-insulator (SOI) wafer including Si-containing material having an oxide layer buried therein, said method comprising:
   a) providing a gate insulator layer on a top Si surface of the SOI material;
   b) forming a plurality of electrode structures on said gate insulator layer, each electrode structure including a pair comprising a source electrode and a drain electrode, each of said source electrode and said drain electrode formed by depositing a first metal electrode layer from the group consisting of Al, Er, Gd, Nd, Ti and Y, followed by depositing a second metal layer from the group consisting of Ag, Al, Au, Cr, Cu, Mg, Ni and Pt;
   c) annealing said electrode structures at an elevated temperature in an inert atmosphere;
   d) for each of said electrode structures, depositing a gate electrode layer on the gate insulator between said formed source and gate electrodes;
   e) providing a protective mask layer over each of said electrode structures and said top Si surface of said SOI material, said protective mask being in a shape of an array of isolated mesas;
   f) removing Si material not protected by the protective mask layer to form an array of isolated Si mesas comprising portions of said top Si surface; and
   g) removing the protective mask layer from the array of isolated Si mesas comprising said portions of said top Si surface.

2. The method of claim 1, wherein the annealing step is carried out at a temperature of 440 to 475° C. for a period of 5 to 15 minutes in an inert atmosphere.

3. The method of claim 1, wherein the step of providing the protective mask layer includes providing a protective layer of photoresist over each of said electrode structures and said top Si surface.

4. The method of claim 3, further including using a mask to form a layer of photoresist material into said protective mask layer having the shape of an array of isolated mesas on the top Si surface.

5. The method of claim 1, further including the step of irradiating said top Si surface of the test device with light having a wavelength shorter than the bandgap wavelength of the top Si surface.

6. The method of claim 1, further including the step of: forming a further gate electrode on a bottom surface of said SOI wafer.

* * * * *